US010749572B2

(12) United States Patent
Maillet et al.

(10) Patent No.: US 10,749,572 B2
(45) Date of Patent: Aug. 18, 2020

(54) NEAR-FIELD COMMUNICATION CIRCUIT, INTERFACE, AND SYSTEM

(71) Applicants: STMicroelectronics (Grenoble 2) SAS, Grenoble (FR); STMicroelectronics (Rousset) SAS, Rousset (FR)

(72) Inventors: Gwenael Maillet, Grenoble (FR); Jean-Louis Labyre, Sassenage (FR); Gilles Bas, Beauvoisin (FR)

(73) Assignees: STMICROELECTRONICS (ROUSSET) SAS, Grenoble (FR); STMICROELECTRONICS (GRENOBLE2) SAS, Grenoble (FR)

( * ) Notice: Subject to any disclaimer, the term of this patent is extended or adjusted under 35 U.S.C. 154(b) by 0 days.

(21) Appl. No.: 16/277,678

(22) Filed: Feb. 15, 2019

(65) Prior Publication Data
US 2019/0268040 A1    Aug. 29, 2019

(30) Foreign Application Priority Data

Feb. 27, 2018  (FR) ...................... 18 51738

(51) Int. Cl.
*H04B 5/00* (2006.01)
*H03K 7/08* (2006.01)
*G06K 19/07* (2006.01)

(52) U.S. Cl.
CPC ....... *H04B 5/0025* (2013.01); *G06K 19/0723* (2013.01); *H03K 7/08* (2013.01); *H04B 5/0062* (2013.01)

(58) Field of Classification Search
CPC ....... H04B 5/0025; H04B 5/0062; H03K 7/08
See application file for complete search history.

(56) References Cited

U.S. PATENT DOCUMENTS

| 10,353,384 | B1* | 7/2019 | Tran | G06K 7/10316 |
| 2007/0279225 | A1* | 12/2007 | Pellerano | G06K 19/0707 340/572.1 |
| 2009/0088077 | A1 | 4/2009 | Brown et al. | |
| 2009/0109003 | A1 | 4/2009 | Tucker et al. | |
| 2009/0174592 | A1 | 7/2009 | Muellner | |

(Continued)

FOREIGN PATENT DOCUMENTS

FR    2992081 A1    12/2013
JP    2012134721 A    7/2012

OTHER PUBLICATIONS

STMicroelectronics, ST25DVO2K-WI, ST25DVO2K-W2, "Dynamic NFC/RFID tag IC with 2-Kbit EEPROM with up to 2x pulse width modulation outputs," https://www.st.com/resource/en/data_brief/st25dv02k-wl.pdf, Feb. 2018, 3 pages.

*Primary Examiner* — Lewis G West
(74) *Attorney, Agent, or Firm* — Slater Matsil, LLP

(57) ABSTRACT

A circuit includes a near-field communication circuit configured to receive a radio frequency control signal transmitted in a near-field regime, a pulse width modulation signal generation circuit coupled to the near-field communication circuit circuit and configured to generate a pulse width modulation signal according to the radio frequency control signal, and a non-volatile memory coupled to both the near-field communication circuit circuit and the pulse width modulation signal generation circuit, the non-volatile memory comprising digital words for configuring the pulse width modulation signal.

20 Claims, 7 Drawing Sheets

(56) References Cited

U.S. PATENT DOCUMENTS

| | | |
|---|---|---|
| 2009/0251289 A1 | 10/2009 | Amtmann |
| 2010/0171598 A1* | 7/2010 | Mehring .............. A01K 11/004 |
| | | 340/10.5 |
| 2011/0084807 A1 | 4/2011 | Logan et al. |
| 2011/0148594 A1 | 6/2011 | Kang |
| 2011/0248834 A1 | 10/2011 | Warner et al. |
| 2011/0273271 A1* | 11/2011 | Alicot ................. H04L 25/4902 |
| | | 340/10.1 |
| 2013/0015798 A1 | 1/2013 | Wright |
| 2014/0086301 A1* | 3/2014 | Akhavan ........... H04L 25/03828 |
| | | 375/238 |
| 2014/0249825 A1 | 9/2014 | Proud |
| 2015/0303992 A1* | 10/2015 | Kim ................... G06K 7/10247 |
| | | 455/41.1 |
| 2016/0019404 A1 | 1/2016 | Powell |
| 2016/0079973 A1* | 3/2016 | Ding ........................ H03K 5/19 |
| | | 327/172 |
| 2017/0017814 A1* | 1/2017 | Roberts ................. B25J 13/088 |
| 2018/0041201 A1 | 2/2018 | Tang et al. |

* cited by examiner

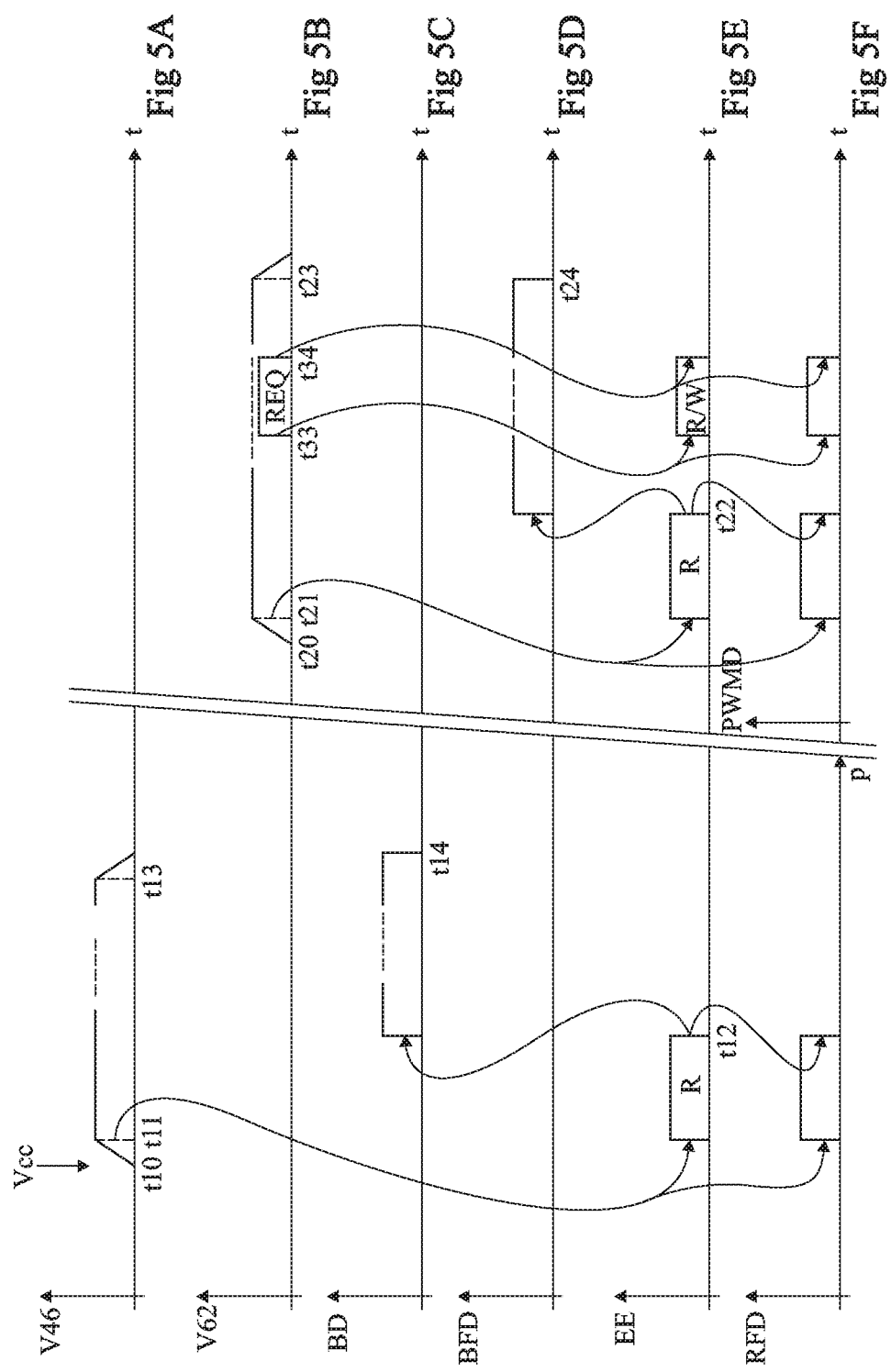

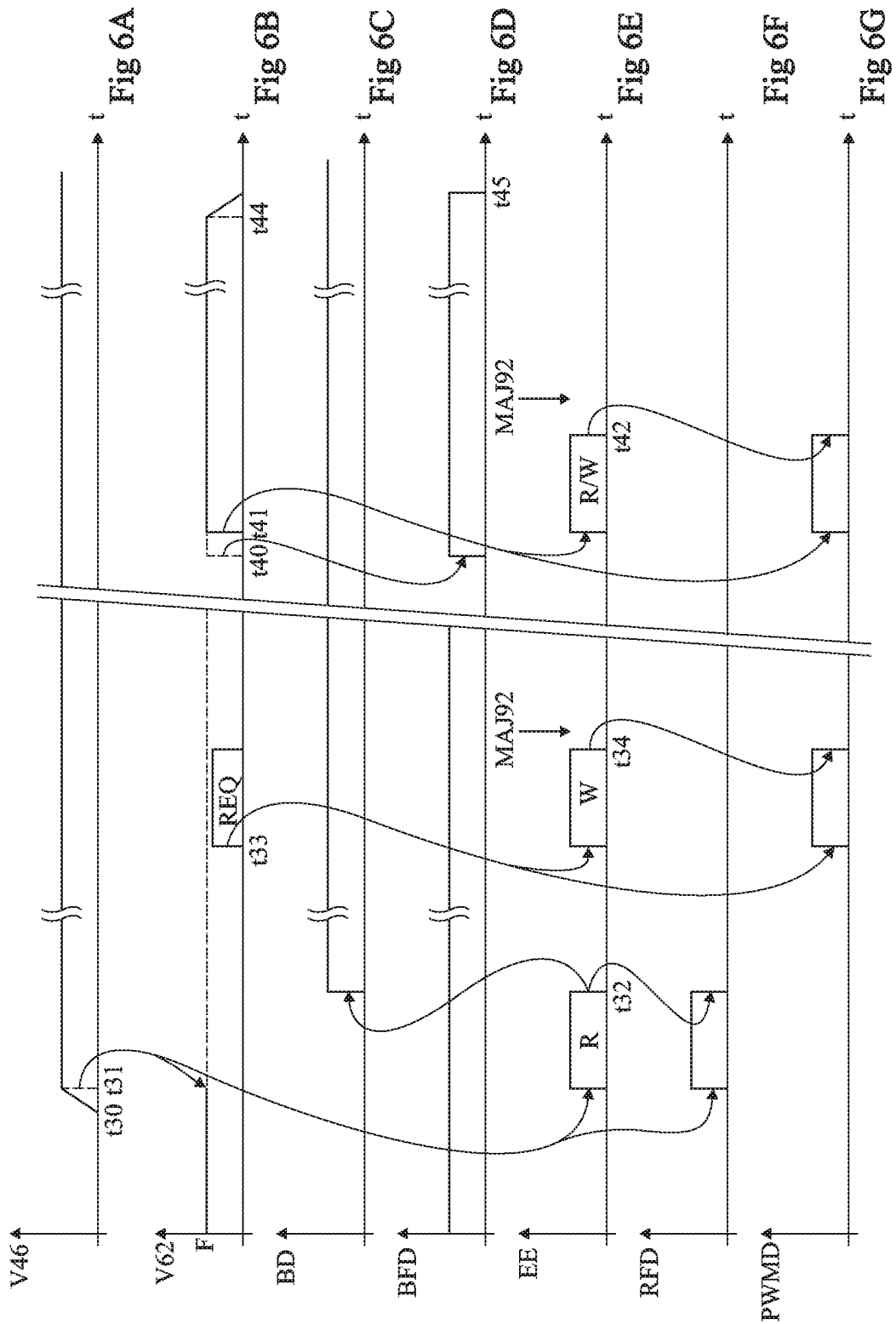

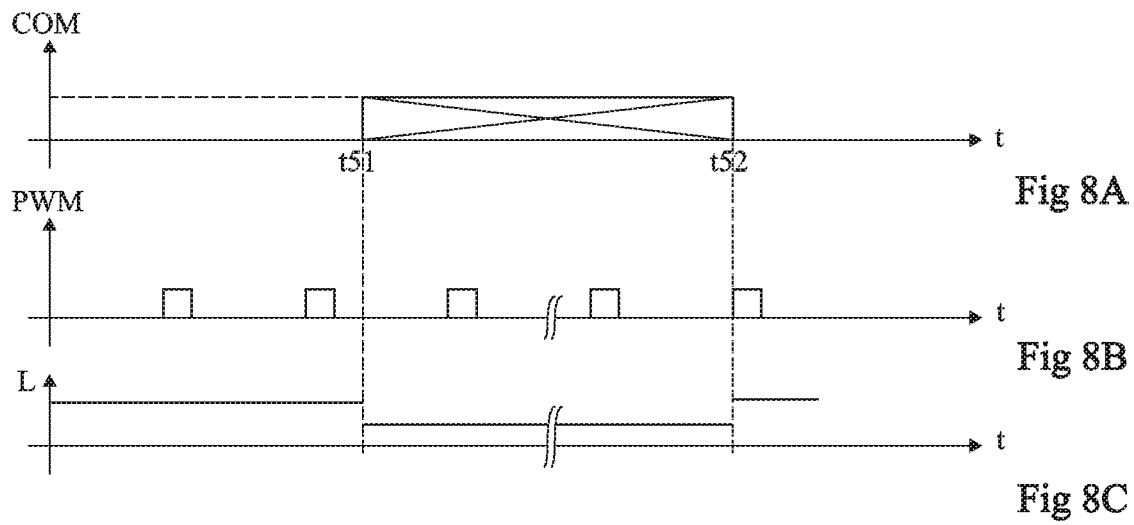
Fig 8A
Fig 8B
Fig 8C
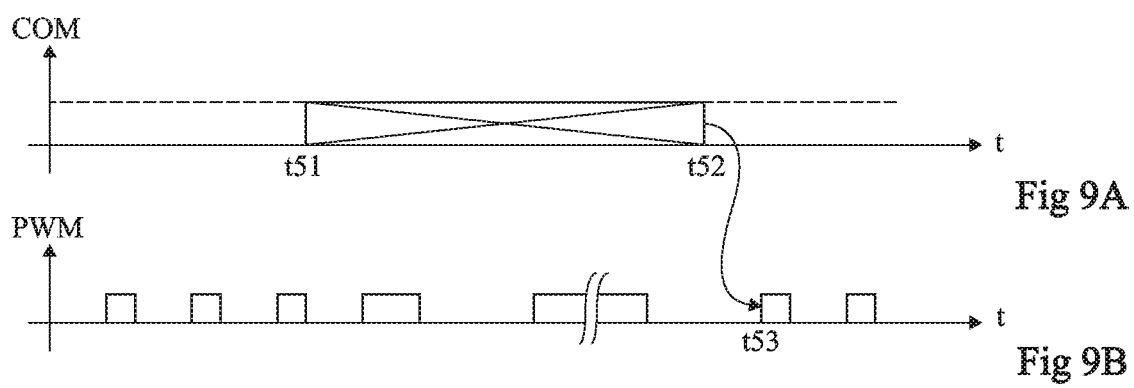
Fig 9A
Fig 9B
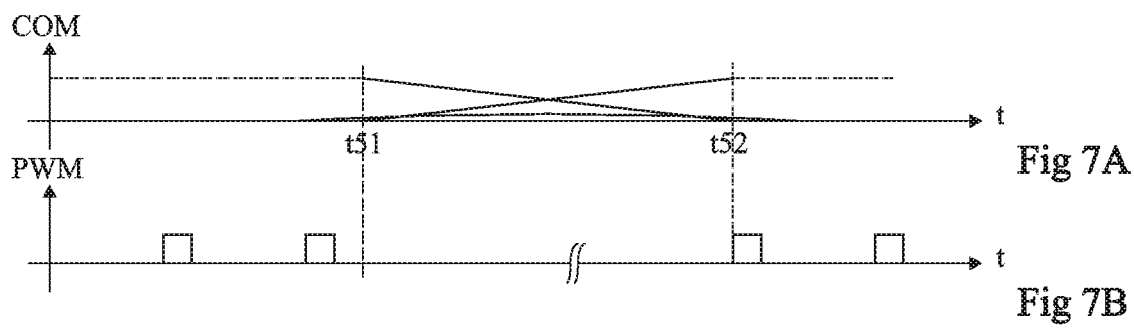
Fig 7A
Fig 7B

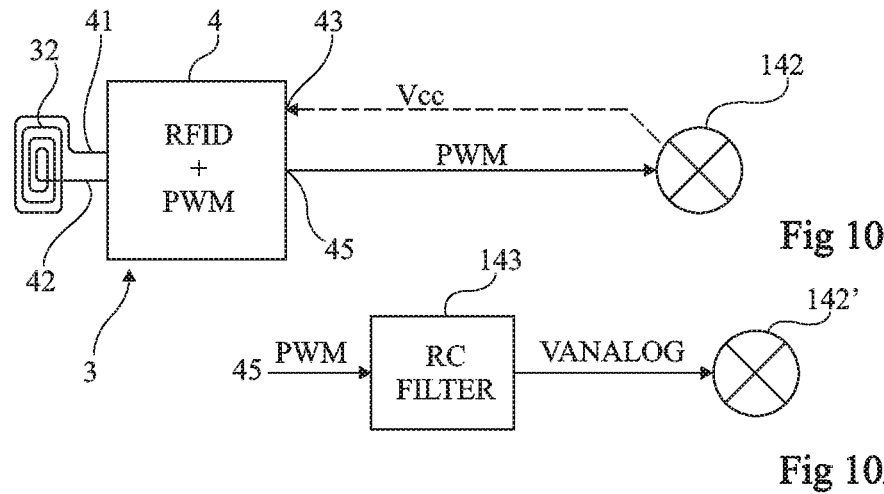
Fig 10
Fig 10A
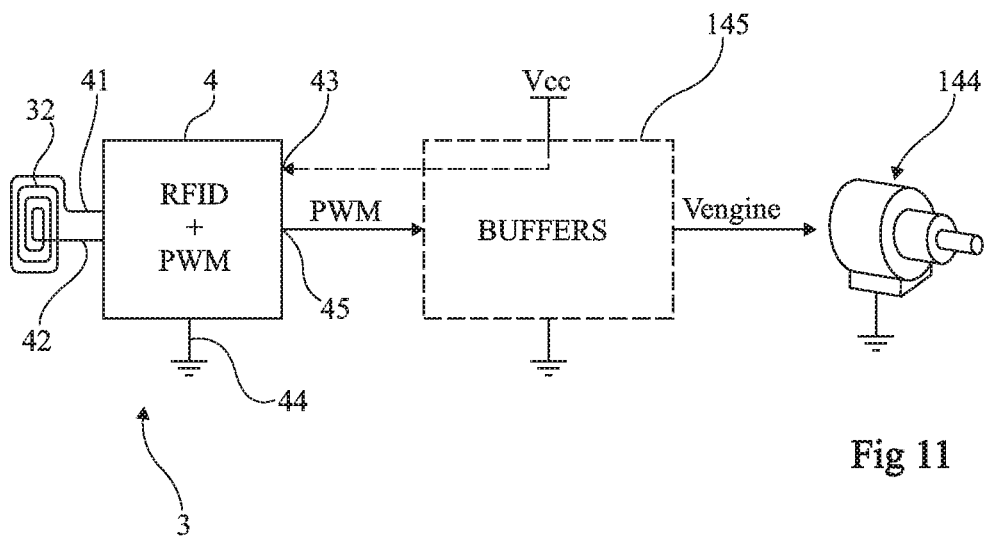
Fig 11

NEAR-FIELD COMMUNICATION CIRCUIT, INTERFACE, AND SYSTEM

This application claims the priority benefit of French Patent Application No. F18/51738, filed on Feb. 27, 2018, the content of which is hereby incorporated by reference in its entirety to the maximum extent allowable by law.

CROSS-REFERENCE TO RELATED APPLICATIONS

This application is related to U.S. patent application Ser. No. 16/277,698 which claims priority to French Patent Application No. FR18/51737, filed on Feb. 27, 2018, and to U.S. patent application Ser. No. 16/286,345 which claims priority to French Patent Application No FR18/51735, filed on Feb. 27, 2018, both of which are incorporated herein by reference in their entirety.

TECHNICAL FIELD

The present disclosure generally relates to electronic circuits and, more specifically, to electromagnetic transponders or electronic tags using the RFID (Radio Frequency Identification) technology. The present disclosure more particularly applies to the control of equipment from an electronic tag.

BACKGROUND

Communication systems comprising electromagnetic transponders are more and more frequent, particularly since the development of near-field communication (NFC) technologies, equipping, in particular, cell phones.

Such systems use a radio frequency electromagnetic field emitted by a device (terminal or reader) to communicate with another device (card or tag). An NFC device comprises a resonant circuit formed of one or a plurality of antennas (inductive elements) and of one or a plurality of capacitive elements for detecting an electromagnetic field. The voltage recovered across the resonant circuit is processed by electronic circuits of the device or transponder to extract the power necessary to its operation, decode data transmitted via a modulation of the electromagnetic field, transmit data in retromodulation, etc.

In applications targeted by the present disclosure, an electronic tag is intended to detect control or configuration data intended for equipment having this tag coupled thereto. Such data should thus be converted into signals interpretable by the equipment (the application) to be controlled.

SUMMARY

In accordance with an embodiment, a circuit includes a near-field communication circuit configured to receive a radio frequency control signal transmitted in a near-field regime, a pulse width modulation signal generation circuit coupled to the near-field communication circuit circuit and configured to generate a pulse width modulation signal according to the radio frequency control signal, and a non-volatile memory coupled to both the near-field communication circuit circuit and the pulse width modulation signal generation circuit, the non-volatile memory comprising digital words for configuring the pulse width modulation signal.

In accordance with another embodiment, a system includes a near-field communication device configured to transmit a radio frequency control signal in a near-field regime and an interface. The interface includes an near-field communication circuit configured to receive the radio frequency control signal. The interface further includes a pulse width modulation signal generation circuit coupled to the near-field communication circuit and configured to generate a pulse width modulation signal according to the radio frequency control signal. The system further includes a non-volatile memory coupled to both the near-field communication circuit and the pulse width modulation signal generation circuit. The non-volatile memory includes digital words for configuring the pulse width modulation signal. The system also includes an electrically-controllable equipment configured to be controlled by the pulse width modulation signal.

In accordance with still another embodiment a method of assigning access of a non-volatile memory includes receiving, by a near-field communication circuit, a radio frequency signal, assigning, by a memory assignment circuit, access of a non-volatile memory to the near-field communication circuit, and detecting, by the memory assignment circuit, that a pulse width modulation signal generation circuit is powered. The memory assignment circuit is separate from the pulse width modulation signal generation circuit. The method further includes assigning, by the memory assignment circuit, access of the non-volatile memory to the pulse width modulation signal generation circuit in response to detecting that the pulse width modulation signal generation circuit is powered.

BRIEF DESCRIPTION OF THE DRAWINGS

FIGS. 5A, 5B, 5C, 5D, 5E, and 5F schematically illustrate example timing diagrams of operating situations of the interface circuit in accordance with an embodiment of the invention;

FIGS. 6A, 6B, 6C, 6D, 6E, 6F, and 6G schematically illustrate example timing diagrams of other operating situations of the interface circuit in accordance with an embodiment of the invention;

FIGS. 7A and 7B schematically illustrate timing diagrams of a noise reduction method in accordance with an embodiment of the invention;

FIGS. 8A, 8B, and 8C schematically illustrate timing diagrams of another implementation of a noise reduction method in accordance with an embodiment of the invention;

FIGS. 9A and 9B schematically illustrate timing diagrams of still another implementation of a noise reduction method in accordance with an embodiment of the invention;

FIG. 10 schematically illustrates a block diagram of a system implementing all or part of the described embodiments;

FIG. 10A illustrates a variation of the system of FIG. 10;

FIG. 11 schematically illustrates a block diagram of another system implementing all or part of the described embodiments;

Figure 1:
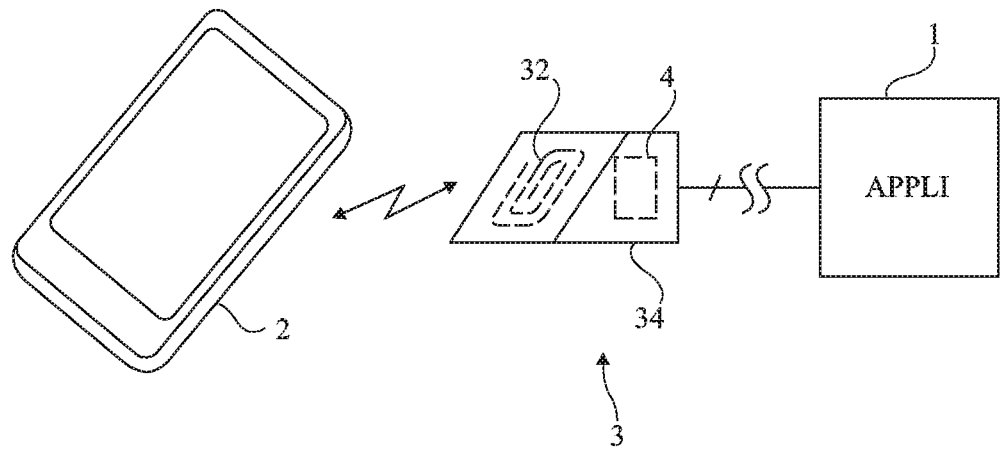
FIG. 1 illustrates a simplified block diagram of an example system in accordance with an embodiment of the invention.

The foregoing and other features and advantages will be discussed in detail in the following non-limiting description of specific embodiments in connection with the accompanying drawings.

DETAILED DESCRIPTION OF ILLUSTRATIVE EMBODIMENTS

The same elements have been designated with the same reference numerals in the different drawings.

For clarity, only those steps and elements which are useful to the understanding of the embodiments which will be described have been shown and will be detailed. In particular, the generation of the radio frequency signals and the interpretation thereof have not been detailed, the described embodiments being compatible with usual techniques of generation and interpretation of these signals. Further, the interpretation of the control signals by the equipment has not been detailed either, the described embodiments here again being compatible with usual techniques.

Throughout the present disclosure, the term "connected" is used to designate a direct electrical connection between circuit elements, whereas the term "coupled" is used to designate an electrical connection between circuit elements that may be direct, or may be via one or more intermediate elements.

The terms "approximately", "about", and "in the order of" are used herein to designate a tolerance of plus or minus 10%, preferably of plus or minus 5%, of the value in question.

An embodiment overcomes all or part of the disadvantages of known techniques for controlling equipment based on data received by near-field communication.

An embodiment provides a solution more particularly adapted to a system where the near-field communication is used to modify a configuration or a parameterizing of the equipment.

An embodiment provides an interface integrated circuit between a near-field communication environment and an equipment control wire environment.

Thus, an embodiment provides an integrated circuit comprising a first near-field communication unit, and a second unit for generating at least one signal in pulse-width modulation.

According to an embodiment, the second unit is in wired logic.

According to an embodiment, the circuit further comprises a non-volatile memory containing at least digital PWM signal configuration words.

According to an embodiment, the first unit has access to the memory in write and in read mode.

According to an embodiment, the second unit has access to the memory in read mode only.

According to an embodiment, the circuit further comprises a third unit, different from the second unit, for assigning the memory to the first unit or to the second unit.

According to an embodiment, the third unit is a state machine in wired logic.

According to an embodiment, the third unit detects the presence of a voltage on power supply terminals of the circuit.

According to an embodiment, the third unit gives priority to the unit having started an access to the memory.

According to an embodiment, terminals of the circuit are exclusively distributed into: two terminals of connection of an antenna to the first unit; two terminals intended to receive a DC voltage from a device controlled by the PWM signal(s); and as many terminals as there are generated PWM signals.

According to an embodiment, the circuit comprises no microprocessor or microcontroller.

According to an embodiment, the generation of the PWM signal is modifiable during a near field radio frequency communication.

An embodiment provides an interface of conversion of digital words for configuring at least one PWM signal, comprising a circuit such as hereabove.

According to an embodiment, the interface further comprises a near-field communication antenna.

According to an embodiment, the first unit draws the power necessary to its operation from a radio frequency field.

According to an embodiment, the second unit is exclusively powered by equipment for which the PWM signals are intended.

An embodiment provides a system comprising: at least one interface of conversion of digital words for configuring at least one PWM signal; and at least one electrically-driven piece of equipment.

According to an embodiment, the system further comprises a near-field communication device.

FIG. 1 illustrates a simplified block diagram of a system to which embodiments which will be described apply as an example.

Such a system comprises an equipment 1 (APPLI) to be controlled or to be configured, depending on the application for which the system is intended, a device 2 equipped to transmit, in a near-field regime, control, configuration, or parameterizing data intended for equipment 1, and an interface 3 capable of converting the data received in a near-field regime from device 2 into data capable of being interpreted by equipment 1 to be controlled.

Equipment 1 to be controlled is, for example, an illumination device or circuit comprising, for example, light-emitting diodes (LEDs), an electric motor, a linear motor or a stepping motor, a fluid circulation control valve, a servo-motor, and/or more generally any equipment capable of being controlled, directly or indirectly, by an electrical signal.

Device 2 is, for example, a control device such as a smart phone equipped with an NFC controller, an NFC reader dedicated to the application, and more generally any device (generally called reader or terminal) equipped with a circuit of generation and of modulation of a near-field communication radio frequency field intended for an electronic tag, preferably a circuit compatible with standard ISO/IEC 15693, or with standard ISO/IEC 14443. Reference is made to acronym NFC to designate near-field communications, but this does not necessarily mean according to the NFC-Forum. Indeed, the described embodiments are more generally compatible with radio frequency communications, currently called RFID or NFC.

In the applications targeted by the present disclosure, interface 3 is intended to store control or configuration data sent to equipment 1 to be controlled, for example, on request, typically when the application equipment is powered on or turned on or initialized. Thus, interface 3 is equipped with a memory of non-volatile storage of control or configuration data intended for equipment 1.

An easy solution is to provide, in interface 3, an electronic tag formed of an NFC controller associated with a reprogrammable non-volatile memory for storing the control and configuration data, and a microcontroller or microprocessor generating electric signals for controlling equipment 1 based on data read from the memory of the electronic tag. However, such a solution is particularly expensive and requires for the microcontroller to be programmed in order to manage communications with the electronic tag.

According to the described embodiments, it is provided to take advantage of the fact that, in the targeted systems, equipment 1 to be controlled does not need to communicate with device 2, that is, to send data to device 2. Equipment 1 just extracts data of configuration and of control of interface 3. In other words, the communication is unidirectional from device 2 to equipment 1 to be controlled.

Thus, interface 3 comprises an antenna 32 (in dotted lines in FIG. 1) and a interface circuit 4 (also in dotted lines in FIG. 1), which may be an integrated circuit (IC), for example, capable of communicating in near-field with device 2 and of supplying the electric control signals to the application, and thus to equipment 1. In the example shown in FIG. 1, interface 3 is housed in a package 34, different from the device to be controlled. However, according to the application, interface 3 may be housed in a package or an enclosure of equipment 1 to be controlled.

A difficulty however is that interface 3 should exchange with device 2, if only to be correctly identified by said device and confirm the correct reception of the received data. Further, interface 3 should be able to be triggered by equipment 1 to be controlled in order to supply the stored data. Now, the memory of storage of the control data cannot be accessed by device 2 and be read by equipment 1 at the same time.

Figure 2:
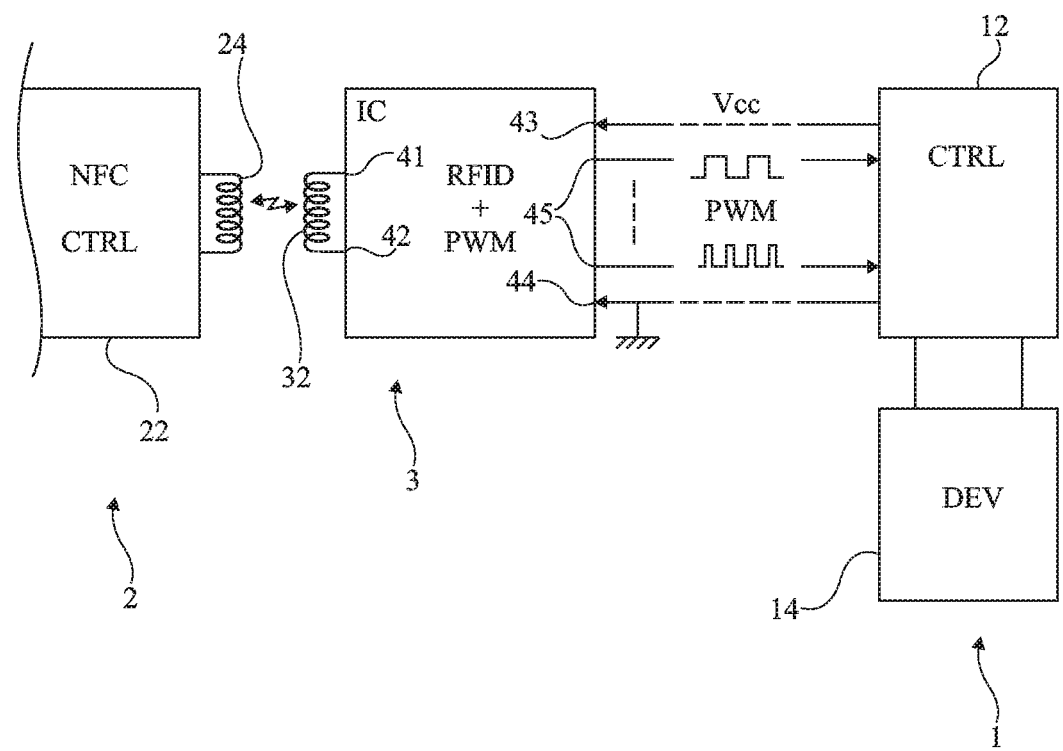
FIG. 2 illustrates a simplified block diagram of an example interface circuit and surrounding environment in accordance with an embodiment of the invention.

FIG. 2 illustrates a simplified block diagram of an example interface circuit and surrounding environment.

According to this embodiment, interface circuit 4 (IC, RFID+PWM), forming, with antenna 32, interface 3, comprises: two terminals 41 and 42 of connection of antenna 32; two terminals 43 and 44 intended to receive a DC power supply voltage Vcc, one (44) of the two terminals defining a reference potential, typically, the ground; and a terminal 45 intended to supply a signal in pulse width modulation (PWM) to a control circuit 12 (CTRL) of equipment 1.

In the shown example, a plurality of terminals 45 supply equipment 1 with a plurality of pulse-width modulated signals. The number of signals depends on the application and different examples will be illustrated hereafter.

Control circuit 12, included in equipment 1, has the function of interpreting the PWM signals received from interface circuit 4 to control an electrical device 14 (DEV) of the equipment 1 (a lamp, a motor, etc.). Preferably, the DC voltage Vcc applied between terminals 43 and 44 is supplied by (or under control of) control circuit 12. This enables, as will be seen hereafter, triggering of a reading of the data stored in interface circuit 4 with no additional control signal. Generally, control circuit 12 does not non-volatilely store the data that it receives from interface circuit 4, but only comprises volatile storage circuits (for example, flip-flops or registers) and should thus receive, at each powering on or resetting, the PWM signal(s) generated by interface circuit 4.

Figure 3:
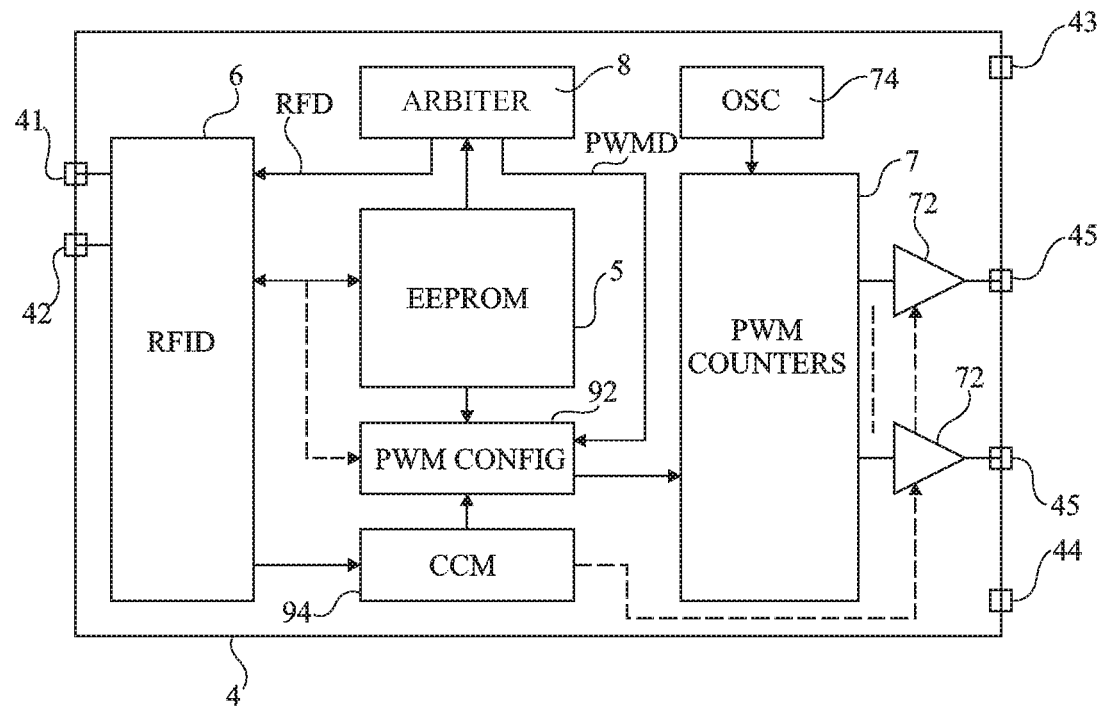
FIG. 3 schematically illustrates a block diagram of an example interface circuit in accordance with an embodiment of the invention.

FIG. 3 schematically illustrates a block diagram of an example interface circuit in accordance with an embodiment of the invention.

The representation of FIG. 3 is functional. In practice, all the elements may be made in integrated form in a same chip. Further, for simplification, the signals powering the different components of interface circuit 4 are not illustrated in FIG. 3. The power supply signals are however discussed hereafter.

Interface circuit 4 comprises a memory 5, for example, a reprogrammable non-volatile memory such as an EEPROM or a flash memory; an NFC circuit 6 (RFID); a PWM signal generation circuit 7 (e.g. a logic circuit) generating PWM signals from digital reference words contained in memory 5, a memory assignment circuit 8 (ARBITER), a logic circuit, for example, for allocating memory 5 to one or the other of circuits (e.g. the NFC circuit 6 or the PWM signal generation circuit 7); and a PWM configuration circuit 92 (PWM CONFIG), a logic circuit, for example, for configuring PWM signal generation circuit 7.

Interface circuit 4, shown in FIG. 3, also comprises, among others: one or a plurality of amplifiers 72 of the PWM signals generated by PWM signal generation circuit 7, the outputs of amplifiers 72 being coupled, preferably connected, to terminals 45; and an oscillator 74 (OSC) for generating a sequencing signal for PWM signal generation circuit 7.

In practice, PWM signal generation circuit 7 is formed of an assembly of counters, sequenced by oscillator 74 and controlled by PWM configuration circuit 92 based on words read by the latter from memory 5. The generation of PWM signals based on digital words for parameterizing these signals is usual per se.

NFC circuit 6 is coupled, preferably connected, to terminals 41 and 42. NFC circuit 6 forms the NFC interface of interface circuit 4. NFC circuit 6 has, among others, the function of: detecting a radio frequency field where interface circuit 4 is located; extracting from this field a voltage for powering at least memory 5, NFC circuit 6, and memory assignment circuit 8 when no voltage is applied between terminals 43 and 45; demodulating data present on the radio frequency signal transmitted by device 2 (FIGS. 1 and 2) and sending back to device 2 data contained in the memory, such as for example the identifier of interface circuit 4, or sending at least some of the data to memory 5 for their storage; and generating signals of retromodulation (preferably by passive load modulation) of the field where interface 3 is located.

The data stored in memory 5 are, among others: radio frequency configuration data and in particular an identifier of interface circuit 4 to enable a reader to determine that it effectively communicates with the desired application; data relative to the coding of the PWM signal(s), among which the frequencies, the duty cycles, and the phase ratios of the PWM signals; and system or user data linked to the application.

Memory 5 is only read by PWM configuration circuit 92 each time the interface circuit 4 is booted, which is triggered by the presence of a DC power supply voltage originating from the application, and is not read between two of said boot or initialization operations. Memory 5 is read by NFC circuit 6, at each boot operation, be it caused by the presence of a DC voltage originating from the application or during an activation by the radio frequency field. In the presence of an activation by the radio frequency field, data of configuration of the radio frequency communication with NFC circuit 6 as well as, for example, the single identifier of interface circuit 4, are extracted from memory 5. Memory 5 is only written into by NFC circuit 6.

According to the described embodiments, NFC circuit 6, PWM signal generation circuit 7, and PWM configuration circuit 92 are state machines in wired logic, that is, are not programmable (they contain no registers), but are formed of flip flops and of combinatory logic functions (OR, AND, etc.). For example, wired logic can be implemented using only passive components such as diodes and/or resistors.

In the described embodiments, memory 5 is only read by the application at the booting of or on application of voltage Vcc to interface circuit 4. Further, the memory is only programmed by NFC circuit 6.

According to a preferred embodiment, to authorize a modification of the PWM signals without requiring rebooting of the interface circuit 4, PWM configuration circuit 92 receives (connection in dotted lines in FIG. 3) from NFC circuit 6 the words that the circuit writes into memory 5. Preferably, PWM configuration circuit 92 only modifies the PWM signals (PWM signal generation circuit 7) once the writing into memory 5 has ended to guarantee that the configuration (the PWM signals) is the same at the next reboot. As a variation, the PWM signals are modified in parallel with the writing into the memory for applications where it is accepted to return to the previous configuration in the case where the writing into memory 5 fails.

As previously mentioned, any conflict of access to memory 5 should be avoided. This function is ensured by memory assignment circuit 8 which arbitrates accesses to the memory.

According to the described embodiments, such an arbitration is advantageously performed by detecting where the power first originated from and by giving priority to the corresponding side (RFID or PWM).

This is a particularly simple solution since a multiple situations are directly settled according to whether such or such circuit is powered or not.

Figure 4:
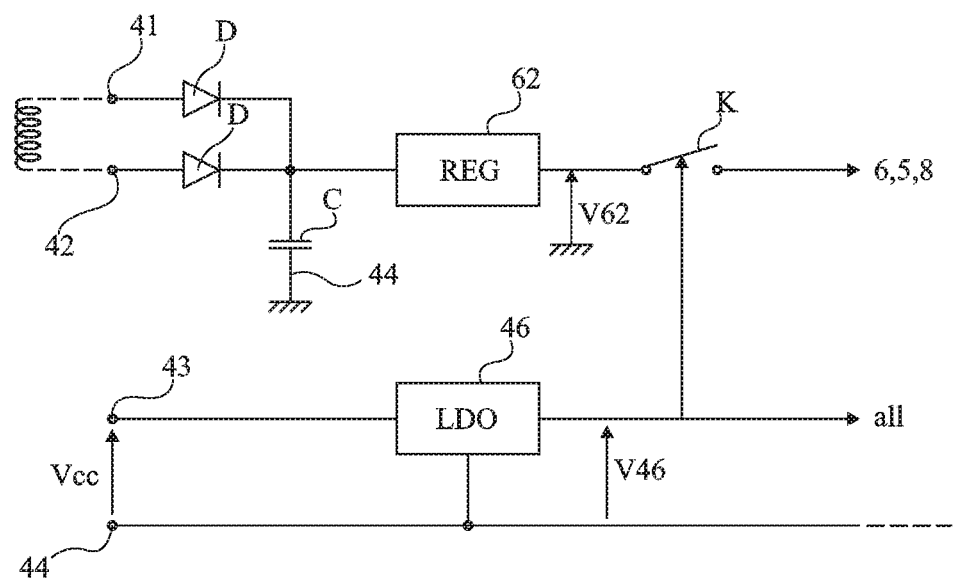
FIG. 4 schematically and functionally illustrates power sources of different components of an interface circuit in accordance with an embodiment of the invention.

FIG. 4 schematically and functionally illustrates power sources of different components of an interface circuit.

A power supply voltage may either originate from the electromagnetic field generated by the device (2, FIGS. 1 and 2), or from the equipment (1, FIG. 1).

Schematically, terminals 41 and 42 are coupled, by rectifying elements (diodes D), to a regulator 62 (REG), a capacitive element C coupling the cathodes of the diodes to ground (terminal 44). Regulator 62 may be a simple limiter or a more advanced regulator. An output of regulator 62 powers, in the presence of a radio frequency field, NFC circuit 6, memory 5, and memory assignment circuit 8. The output of regulator 62 is controllable by a switch K (e.g. a normally-on switch). Switch K is driven (turned off) when a voltage Vcc is present between terminals 43 and 44. A regulator 46 such as a linear regulator, for example, a low drop-out regulator (LDO), powers, in the presence of a voltage Vcc, all the components of interface circuit 4 with a voltage V46 and turns off switch K.

Thus, it can already been seen that the generation of the PWM signals and the reading from the memory by PWM configuration circuit 92 can only occur when a voltage is present between terminals 43 and 44. Further, the generation of the PWM signals is only present while voltage Vcc is present.

However, on the side of NFC circuit 6, the latter is powered either by the field, or by voltage Vcc.

Accordingly, if interface circuit 4 is booted (powered on) by the reception of a radio frequency signal, only NFC circuit 6 has access to the memory in read or in write mode. If the circuit is booted (powered on) by voltage Vcc, all circuits and components are powered. Accordingly, memory 5 is accessible by NFC circuit 6 and PWM configuration circuit 92 and an arbitration may be necessary, in particular if a radio frequency field also appears. However, memory 5 is preferably only read from by PWM configuration circuit 92 at the starting of a power supply by the application. Accordingly, although the PWM signals are permanently supplied to the application by PWM signal generation circuit 7 in the presence of voltage Vcc, they are only initialized by PWM configuration circuit 92 at the booting or on request of NFC circuit 6.

The operation of memory assignment circuit 8 is functionally described hereafter based on timing diagrams illustrating different situations which are likely to occur.

FIGS. 5A, 5B, 5C, 5D, 5E, and 5F schematically illustrate example timing diagrams of operating situations of the interface circuit.

The drawings particularly illustrate the operation of interface circuit 4 at the booting in two non-conflicting cases according to which the booting is performed in the presence of voltage Vcc only (left-hand portion of the timing diagrams) and in the presence of voltage V62 (originating from the field) only (right-hand portion of the timing diagrams).

FIG. 5A shows an example of shape of voltage V46 output by regulator 46. FIG. 5B shows an example of shape of voltage V62 output by regulator 62. FIG. 5C shows the state of a signal BD (Boot Done) indicative of a complete booting of interface circuit 4 (including booting of NFC circuit 6, PWM signal generation circuit 7, and PWM configuration circuit 92). FIG. 5D shows the state of a signal BFD (Boot Field Done) indicative of a booting of NFC circuit 6 under the effect of voltage V46. FIG. 5E shows the periods of access to memory 5 (EE). FIG. 5*f* shows, in its left-hand portion, the state of a signal RFD (RF Disable) supplied by memory assignment circuit 8 to NFC circuit 6, for deactivating the radio frequency functionality and, in its right-hand portion, the state of a signal PWMD (PWM Disable) supplied by NFC circuit 6 to PWM configuration circuit 92, for deactivating the functionality of reading the PWM data from the memory.

Memory assignment circuit 8 is powered both by voltage V46 and by voltage V62, to be able to switch the states of signals BDF, BD, RFD, and PWMD in particular.

Boot means that the NFC circuit 6 or PWM configuration circuit 92 which has access to memory 5 in read mode has finished its operations on the memory.

In the left-hand portion of the timing diagrams, it is assumed that voltage Vcc is present between terminals 43 and 44 from a time t10. At a subsequent time t11, regulator 46 has started and supplies a voltage sufficient to power the circuits. In this configuration, from time t11, the memory (signal EE) is read from (R) to extract the PWM signal configuration data. The binary words read from the memory by PWM configuration circuit 92 enable to parameterize the counters of PWM signal generation circuit 7 which will generate, with the clock signal of oscillator 74, the PWM signals intended for amplifiers 72. At a time t12 when the memory has been read and where the PWM signals are ready, it is considered that all circuits are ready (signal BD in the active state). To avoid a conflict of access to the memory while the latter is being read from by PWM configuration circuit 92, memory assignment circuit 8 deactivates the radio frequency functions of interface circuit 4 (signal RFD, FIG. 5F, in the high state) until time t12. Assuming that no reader has presented itself to interface 3, when the application is off and voltage Vcc disappears (time t13), regulator 46 is no longer powered and signals BD and BFD return to their inactive state at a subsequent time t14 from which regulator 46 can no longer hold the power supply voltage.

In the right-hand portion of the timing diagrams, it is assumed that voltage Vcc is not present between terminals 43 and 44, but that from a time t20, a radio frequency field is detected by antenna 32. At a subsequent time t21, voltage V62 (for example, regulated by regulator 62) is sufficient to power NFC circuit 6, memory 5, and memory assignment circuit 8. In such a configuration, from time t21, the memory (signal EE) is read from (R) to extract the radio frequency configuration data. At a time t22 when the memory has been read, signal BFD indicative of a booting by the radio frequency voltage is activated. To avoid a conflict of access to memory 5 while the latter is being read from by NFC circuit 6, memory assignment circuit 8 deactivates (or prevents the activation of) PWM configuration circuit 92 (signal PWMD, FIG. 5F, in the high state) until time t22. It is assumed that at a time t33, NFC circuit 6 receives a memory access request REQ (read or write mode) originating from device 2. At time t33, memory assignment circuit 8 deactivates (or prevents the activation of) PWM configuration circuit 92 (signal PWMD in the high state) to avoid a conflict at the level of memory 5, and NFC circuit 6 can thus communicate with the memory. Once the access has ended (time t34), signal PWMD is switched to its idle state. It is assumed that the application does not initialize the circuit. Accordingly, at a time t24, subsequent to a time t23 when the field disappears, the power supply voltage of memory 5, of NFC circuit 6, and of memory assignment circuit 8, disappears and signal BFD returns to the low state.

For simplification, time shifts due to signal propagations and to switching have been neglected. In practice, it is ensured that there is no conflict, in particular at the level of the accesses to memory 5.

FIGS. 6A, 6B, 6C, 6D, 6E, 6F, and 6G schematically illustrate example timing diagrams of other operating situations of the interface circuit.

These drawings particularly illustrate the operation of interface circuit 4 in the presence of a power supply conflict, that is, if the application supplies a voltage Vcc while the circuit is powered by a field (left-hand portion of the timing diagrams) or if a reader attempts to program the memory while the circuit is powered by the application (right-hand portion of the timing diagrams). In the same way as for FIGS. 5A to 5F, the slight time shifts between switchings are neglected.

FIG. 6A shows an example of shape of voltage V46 (Vcc) supplied by regulator 46. FIG. 6B shows an example of shape of voltage V62 supplied by regulator 62. FIG. 6C shows the state of signal BD (Boot Done) indicative of a complete booting of interface circuit 4 (including booting of NFC circuit 6, PWM signal generation circuit 7, and PWM configuration circuit 92). FIG. 6D shows the state of signal BFD (Boot Field Done) indicative of a booting of NFC circuit 6 under the effect of voltage V46. FIG. 6E shows the periods of access to memory 5 (EE). FIG. 6F shows the state of signal RFD (RF Disable), supplied by memory assignment circuit 8 to NFC circuit 6, for deactivating the radio frequency functionality. FIG. 6G shows the state of signal PWMD of deactivation of PWM configuration circuit 92 for reading the PWM configuration from memory 5.

In the left-hand portion of the timing diagrams of FIGS. 6A to 6G, it is assumed that interface circuit 4 is powered and has started under the effect of the radio frequency field and that the field is still present (state corresponding to that of the right-hand portion of FIGS. 5A to 5F between times t22 and t23). Thus, voltage V62 is present, signal BFD is active and signals BD, RFD, and PWMD are inactive. It is assumed that at time t30, the application supplies a voltage Vcc. As soon as regulator 46 supplies a voltage V46 having a sufficient level (time t31), switch K (FIG. 4) is turned off and the general powering of interface circuit 4 is provided by voltage V46. It is assumed that the field remains present, so that voltage V62 is still present (illustrated in dotted lines in FIG. 6B) but is not used. At time t31, the radio frequency functionality is deactivated (signal RFD in the high state) so that NFC circuit 6 can no longer read from or write into memory 5. From time t31, PWM configuration circuit 92 reads the PWM configuration from memory 5 and configures PWM signal generation circuit 7. When this reading is ended and PWM signal generation circuit 7 is configured (time t32), signal BD switches to the active state and signal RFD is deactivated, to enable the reader to perform a programming if need be.

It is assumed that the field remains present (signal BFD remains active) and that at a time t33, NFC circuit 6 receives a request for writing into the memory originating from the reader. At time t33, memory assignment circuit 8 deactivates PWM configuration circuit 92 to avoid a conflict at the level of memory 5 and NFC circuit 6 can thus communicate with the memory. Once the writing is ended (time t34), the new PWM parameters have to be applied to the application. To achieve this, the configuration parameters are preferably updated in PWM configuration circuit 92 directly by NFC circuit 6. Update MAJ92 (arrow in FIG. 6E) however only preferably intervenes at the end of a period of the PWM signals, not shown in FIGS. 6A to 6G.

According to a variation, not shown, memory assignment circuit 8 deactivates the radio frequency functionality at time t34 and causes a new reading, from the memory, of the configuration parameters by PWM configuration circuit 92.

Signals BD and BFD are respectively switched to their inactive state, as discussed in relation with FIGS. 5A to 5F, when voltage Vcc or the field disappears, which is not the case in the left-hand portion of FIGS. 6A to 6G where it is considered that the field and voltage Vcc remain present.

In the right-hand portion of the timing diagrams of FIGS. 6A to 6G, it is assumed that interface circuit 4 is powered by the application (voltage Vcc) but is not in a radio frequency field (state corresponding to that of the left-hand portion of FIGS. 5A to 5F between times t12 and t13). This also amounts to considering that, at the end of the left-hand portion of FIGS. 6A to 6G, the radio frequency field disappears but that voltage Vcc remains. Thus, voltage V46 is present, signal BD is active and signals BFD, RFD, and PWMD are inactive. It is assumed that at a time too, a reader applies a radio frequency field to modify the configuration of the PWM signals. Since NFC circuit 6 is already initialized by the presence of voltage V46, the presence of the field directly triggers at time too the switching of signal BFD. As soon as the request is demodulated by NFC circuit 6 (time t41), memory assignment circuit 8 deactivates PWM configuration circuit 92 (signal PWMD active) and gives access to the memory to NFC circuit 6. The operation of writing by NFC circuit 6 (times t41 to t42), and then of transfer (MAJ92) of the new parameters by NFC circuit 6 to PWM configuration circuit 92 to transfer them in PWM to the application is similar to that described in the left-hand portion of FIGS. 6A to 6G. In the right-hand portion of the timing diagrams of FIGS. 6A to 6G, it is then assumed that the field disappears at a time t44, causing the switching to the low state of the signal BFD at a time t45.

The forming of memory assignment circuit 8 in the form of a state machine in wired logic is particularly simple. Indeed, switching is caused by the presence of voltages V62 and V46 as well as by the ends of cycles of memory 5. It is thus easy to implement the different functional situations discussed hereabove in relation with FIGS. 5A to 5F and 6A to 6G.

An advantage of the described embodiments is that they enable to decrease the surface area occupied by the integrated circuit with respect to the surface area necessary with a microprocessor or microcontroller.

Another advantage is that the embodiment in the form of state machines in wired logic avoids risks of malfunctions due to program execution errors, as would be the case with a microprocessor or microcontroller.

The fact of integrating, in a same chip, the RFID and PWM functions risks, in certain cases, generating a disturbance of the radio frequency signals under the effect of the PWM signals. Indeed, the proximity of NFC circuit 6 and PWM signal generation circuit 7 may result in that the PWM signals generate noise at the level of NFC circuit 6, which disturbs radio frequency transmissions-receptions.

Such a noise problem is not only present in the interface circuit 4 such as described in relation with FIG. 3, but more generally in any system where digital pulse trains (PWM) are capable of disturbing radio frequency transmissions-receptions due to the proximity of the circuits generating such respective signals. This may be the case, for example, for a microcontroller generating PWM signals and assembled close to an NFC controller or router, or also for two integrated circuits respectively dedicated to a generation of PWM signals and of radio frequency near-field communication signals.

RFID signals which are located in a range of transmission carriers from 10 to 20 MHz, typically in the order of 13.56 MHz with modulation or retromodulation carriers of several hundreds of kHz, typically in the order of 847 kHz, in the order of 484 kHz or in the order of 423 kHz, are particularly sensitive to frequencies of several hundreds of kHz, generally used for PWM signals.

Thus, according to another aspect of the present disclosure, it is provided to intervene, during RFID transmissions, on the generation of the PWM signals to reduce their impact (the noise).

In an interface circuit 4, such as described in FIG. 3, interface circuit 4 comprises an intervention circuit 94 introducing at least one countermeasure to noise during radio frequency transmission-reception. Intervention circuit 94 receives, from NFC circuit 6, information according to which a transmission is present and intervenes on one or a plurality of circuits, among PWM configuration circuit 92, PWM signal generation circuit 7, or amplifiers 72. The countermeasure(s) are applied as soon as a request is received from a reader and until the transmission is ended. This may correspond to the end of a response by interface circuit 4 to device 2 or at the end of a request received from device 2 if the latter calls for no response. A RFID circuit is capable of determining, on reception of a request, if the latter calls for a response or not and can thus trigger intervention circuit 94 and stop it once the radio frequency transmission is ended.

More generally, according to this other aspect, a circuit introducing one or a plurality of countermeasures to noise is provided, in the circuit generating PWM pulses or in a neighboring circuit.

An example applied to interface circuit 4 is described hereafter, but all that is described can be easily transposed to other circuits where similar problems are posed. In particular, the case of the generation of a single PWM signal is considered but all that is described applies whatever the number of generated PWM signals.

For example, the possibility of selecting one or a plurality of countermeasures which are integrated in the circuit is provided in interface circuit 4. Such a selection depends on the application and is determined, for example, in a phase of personalization of interface circuit 4.

FIGS. 7A and 7B schematically illustrate timing diagrams of a noise reduction method.

FIG. 7A illustrates the presence of a radio frequency communication COM. FIG. 7B illustrates an example of PWM signal.

According to this embodiment, it is provided to interrupt the PWM signals during radio frequency transmission periods. Thus, between times t51 and t52, there is no transmission of PWM signals to the application using these signals. Such an interruption suppresses the switching noise of the PWM amplifier and thus any disturbance of the radio frequency signals. The interruption of any PWM signal generally does not adversely affect the operation of the application since a RFID communication generally lasts for less than a few milliseconds.

To interrupt the PWM signals, terminals 45 may be set to high impedance (outputs of amplifiers 72) during the transmission. Such an implementation requires a connection (in dotted lines in FIG. 3) of intervention circuit 94 to amplifiers 72 to set their outputs to high impedance.

As a variation, intervention circuit 94 intervenes on PWM signal generation circuit 7 to place the inputs that it receives from PWM configuration circuit 92 in a steady state interrupting the generation of PWM signals. Such a variation is possible since PWM configuration circuit 92, if it only reads memory 5 at the booting, volatilely stores the parameter in flip-flops and permanently sends them to PWM signal generation circuit 7.

FIGS. 8A, 8B, and 8C schematically illustrate timing diagrams of another implementation of a noise reduction method.

FIG. 8A illustrates the presence of a radio frequency communication COM. FIG. 8B illustrates an example of PWM signal. FIG. 8C illustrates output level L of amplifier 72.

According to this embodiment, the number of output stages used per amplifier 72 is decreased to increase the impedance of terminals 45 and decrease the level of the switching noise. In a way, a variation of the power of the PWM signals is performed according to whether one is or not in the presence of a radio frequency transmission. Advantage is here taken from the fact that amplifiers 72 (e.g. output amplifiers) are generally provided with a plurality of output stages in parallel to be capable of outputting the signals with the required intensities.

Such an embodiment is compatible with applications where the PWM signals are not desired to be totally interrupted.

FIGS. 9A and 9B schematically illustrate timing diagrams of still another implementation of a noise reduction method.

FIG. 9A illustrates the presence of a radio frequency communication COM. FIG. 9B illustrates an example of PWM signal.

According to this embodiment, it is provided to decrease, during radio frequency communications, the frequency of the PWM signals, while keeping their duty cycle (or their phase relationship). Such a frequency decrease enables to decrease the occurrences of communication noise and thus decreases the disturbances of radio frequency signals. As a specific embodiment, for PWM signals at normal frequencies of several tens of kHz, one may, between times t51 and t52, decrease the frequency to a few kHz.

According to still another embodiment, it is provided to combine a power decrease (such as illustrated in FIGS. 8A to 8C) and a frequency decrease (such as illustrated in FIGS. 9A and 9B).

The operation becomes normal again as soon as the radio frequency transmission is ended. However, in the case of a frequency decrease, it will be ascertained to preserve the duty cycle when the frequency is increased back. Thus, the time (t53) from which the frequency becomes normal again may be subsequent to end-of-communication time t52.

All or part of the countermeasures to noise may be provided in interface circuit 4.

According to another aspect of the present disclosure, a system for varying the power of an electrical load by electric pulse-width modulated signals (PWM), with a near-field radio frequency control (RFID), is provided. Thus, a system comprising a RFID or NFC to PWM interface is provided, such a system also comprising a near-field communication control device and PWM electric control equipment. Preferably, the interface is unidirectional, that is, it is intended for applications where the equipment does not need to communicate, at least via the interface, with the control device.

Examples where the practical implementation is performed by an interface 3 such as previously described are described hereafter. However, the described embodiments can be easily transposed to other practical embodiments respecting the described functionalities.

FIG. 10 schematically illustrates a block diagram of a system for varying the power of an electrical load formed by an illumination circuit, the system implementing all or part of the described embodiments.

According to this embodiment, interface 3 is applied to the control of a light signal comprising one or a plurality of lamps 142 (for example, based on light-emitting diodes, or LEDs) to provide a dimmer function. In the example of FIG. 10, lamp 142 is capable of directly receiving a turn on/off and light intensity order in the form of a pulse-width modulated PWM signal. Lamp 142 (for example, the diode control circuit or driver) is then coupled, preferably connected, to a terminal 45 (e.g. an output) of interface circuit 4. Voltage Vcc enabling to power the reading from memory 5 and the generation of the PWM signal is, for example, supplied by lamp 142. A plurality of PWM outputs such as the plurality of terminals 45 of interface circuit 4 may be used to control a plurality of lamp 142.

As compared with a solution with a resistive dimmer, the solution provided herein provides a better accuracy. As compared with a solution with a microcontroller, an advantage of the provided solution is a lower cost without losing accuracy and a lower power consumption. Further, the provided PWM signal solution is compatible with turn-on functions in all or nothing (i.e. 1 or 0).

FIG. 10A partially shows a variation of the system of FIG. 10 according to which lamp 142' needs an analog light intensity control signal VANALOG. It is then provided to interpose a low-pass filter 143 (RC FILTER), for example, a resistive and capacitive cell, to convert the PWM digital signal into an analog level.

FIG. 11 schematically illustrates a block diagram of another system for varying the power of an electrical load formed of a DC electric motor, the system implementing all or part of the described embodiments.

According to this embodiment, interface 3 is applied to the control of a motor 144, for example, a DC drive motor Vengine such as shown or a direct PWM drive motor. Amplifiers 145 (buffers) also powered with voltage Vcc then supplied at terminal 43 of interface circuit 4, may be interposed (according to the current required for the motor).

An advantage of this solution is a great accuracy of control of the motor speed, compatible with a near-field communication control. As compared with a resistive solution, accuracy is gained and, as compared with a solution comprising a microcontroller, cost and power are saved.

According to other embodiments of power variation by RFID control of electric signals in PWM mode (not shown), the PWM signal controls a sound volume variation, a programmed input/output controller, and more generally any equipment adapted to an electric control in power variation.

According to another aspect of the present disclosure, a system of control, with near-field radio frequency signals (RFID), of a driver (servomotor), or an electrically-controlled stepping motor, is provided. Thus, a system comprising a RFID or NFC to PWM interface is provided, such a system also comprising a near-field communication control device and PWM electric control equipment. In the same way as for power variation embodiments, such an interface is preferably unidirectional, that is, it is intended for applications where the equipment does not need to communicate, at least via the interface, with the control device.

As for the previous aspect, examples according to which the practical implementation is performed by an interface 3 such as previously described are described hereafter. However, the described embodiments can be easily transposed to other practical embodiments respecting the described functionalities.

Figure 12:
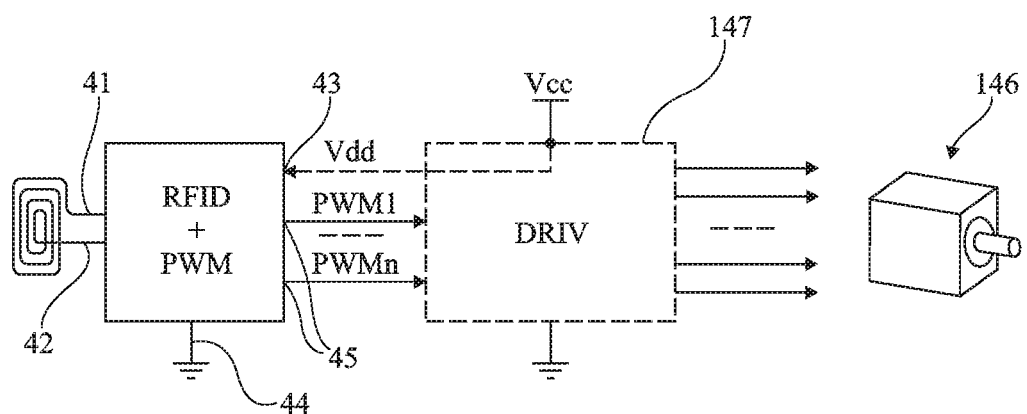
FIG. 12 schematically illustrates a block diagram of still another system implementing all or part of the described embodiments.

FIG. 12 schematically illustrates a block diagram of a system for controlling a stepping motor with PWM signals, the system implementing all or part of the described embodiments.

According to this embodiment, interface 3 is applied to the control of a stepping motor 146. In this case, a plurality of PWM outputs such as the plurality of terminals 45 of interface circuit 4 are used and the generated PWM signals are also provided for a phase control. The number of PWM signals used depends on the application and the control signals required by stepping motor 146. Preferably, an amplification circuit 147 (DRIV) is interposed between interface circuit 4 and motor 146.

An advantage of this solution is, in addition to all or part of the advantages described in relation with the other applications, a low-cost control with a high accuracy.

Figure 13:
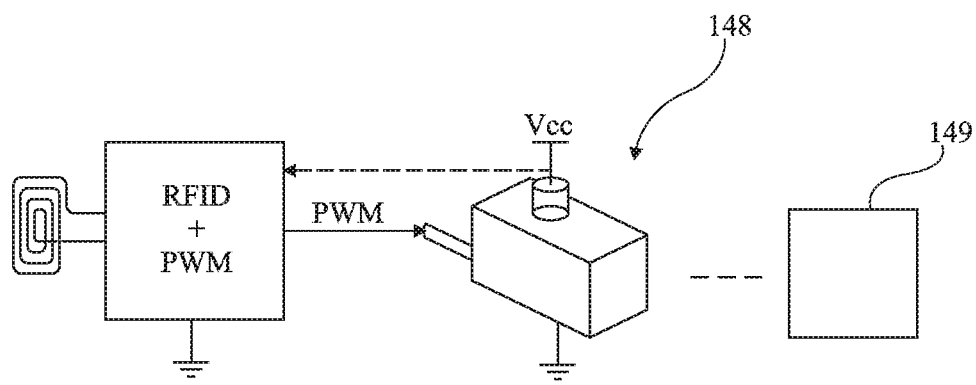
FIG. 13 schematically illustrates a block diagram yet another system implementing all or part of the described embodiments.

FIG. 13 schematically illustrates a block diagram of still another system of control by PWM signals of an electric actuator of servomotor type, the system implementing all or part of the described embodiments.

According to this embodiment, interface 3 is applied to the control of a mechanical object 149 by a servomotor 148. The mechanical position of the servomotor depends on the duty cycle of the PWM signal. Advantage is here taken from the fact of being able to perform, with an NFC interface, a direct, accurate, and low-cost control. The controlled mechanical object 149 may be a valve, a lock, and more generally any objet usually controllable with a servomotor.

Various embodiments have been described. Various alterations, modifications, and improvements will readily occur to those skilled in the art. In particular, the selection of the frequency of the pulse-width modulation signals may be different from one application to another. Further, although a preferred embodiment provides the generation of the PWM signals (PWM signal generation circuit 7 supplies the PWM signals) all along the time during which the circuit is powered (except for some of the described counter measures to noise), it may be provided for the generation of the PWM signals to only occur at the booting. Further, although PWM signal generation circuit 7 and PWM configuration circuit 92 have been described as being two different circuits, they may be one and the same circuit. Finally, the practical implementation of the embodiments which have been described is within the abilities of those skilled in the art based on the functional indications given hereabove.

What is claimed is:

1. A device comprising:
   a near-field communication (NFC) circuit configured to receive a radio frequency (RF) control signal transmitted in a near-field regime;
   a pulse width modulation (PWM) signal generation circuit coupled to the NFC circuit and configured to generate a PWM signal according to the RF control signal;
   a non-volatile memory coupled to both the NFC circuit and the PWM signal generation circuit, the non-volatile memory comprising digital words for configuring the PWM signal; and
   a memory assignment circuit configured to assign access of the non-volatile memory to the NFC circuit or to the PWM signal generation circuit.

2. The device of claim 1, wherein the PWM signal generation circuit is implemented using wired logic.

3. The device of claim 1, wherein the NFC circuit has access to the non-volatile memory in both write mode and read mode.

4. The device of claim 1, wherein the PWM signal generation circuit has access to the non-volatile memory only in read mode.

5. The device of claim 1, wherein the memory assignment circuit is separate from the PWM signal generation circuit.

6. The device of claim 1, wherein the memory assignment circuit is a state machine implemented using wired logic.

7. The device of claim 1, further comprising:
   power supply terminals coupled to each of the NFC circuit, the PWM signal generation circuit, the non-volatile memory, and the memory assignment circuit, wherein the memory assignment circuit is configured to detect the presence of a voltage on the power supply terminals of the circuit.

8. The device of claim 1, wherein the memory assignment circuit is configured to give priority to a detected circuit which started an access to the non-volatile memory, the detected circuit being either the NFC circuit or the PWM signal generation circuit.

9. The device of claim 1, further comprising:
   a plurality of terminals distributed into
       two antenna terminals connected to the NFC circuit and configured to couple an antenna and to the NFC circuit,
       two power input terminals configured to receive a direct current (DC) voltage from an external device controlled by the PWM signal, and
       remaining PWM terminals configured to output one or more PWM signals comprising the PWM signal.

10. The device of claim 1, wherein the non-volatile memory comprises electrically erasable programmable read-only memory (EEPROM).

11. The device of claim 1, wherein the non-volatile memory comprises flash memory.

12. The device of claim 1, wherein the circuit is implemented as an integrated circuit without a microprocessor or a microcontroller.

13. A system comprising:
    a near-field communication (NFC) device configured to transmit a radio frequency (RF) control signal in a near-field regime;
    an interface comprising
        an NFC circuit configured to receive the RF control signal,
        a pulse width modulation (PWM) signal generation circuit coupled to the NFC circuit and configured to generate a PWM signal according to the RF control signal,
        a non-volatile memory coupled to both the NFC circuit and the PWM signal generation circuit, the non-volatile memory comprising digital words for configuring the PWM signal, and
        a memory assignment circuit configured to assign access of the non-volatile memory to the NFC circuit or to the PWM signal generation circuit; and
    an electrically-controllable equipment configured to be controlled by the PWM signal.

14. The system of claim 13, wherein the interface further comprises an NFC antenna.

15. The system of claim 13, wherein the PWM signal generation circuit is implemented using wired logic.

16. The system of claim 13, wherein the NFC circuit has access to the non-volatile memory in both write mode and read mode.

17. The system of claim 13, wherein the PWM signal generation circuit has access to the non-volatile memory only in read mode.

18. A method of assigning access of a non-volatile memory of a near-field communication (NFC) device, the method comprising:
    receiving a radio frequency (RF) signal by an NFC circuit of the NFC device coupled to the non-volatile memory, the RF signal being transmitted in a near-field regime;
    assigning, by a memory assignment circuit of the NFC device, access of the non-volatile memory to the NFC circuit;
    detecting, by the memory assignment circuit, that a pulse width modulation (PWM) signal generation circuit of the NFC device is powered, the PWM signal generation circuit being coupled to the non-volatile memory and separate from the memory assignment circuit; and
    assigning, by the memory assignment circuit, access of the non-volatile memory to the PWM signal generation circuit in response to detecting that the PWM signal generation circuit is powered.

19. The method of claim 18, wherein detecting that the PWM signal generation circuit is powered comprises detecting a voltage on power supply terminals.

20. The method of claim 18, further comprising:
    detecting initiation of an access to the non-volatile memory by a priority circuit; and
    assigning, by the memory assignment circuit, access of the non-volatile memory to the priority circuit, wherein the priority circuit is either the NFC circuit or the PWM signal generation circuit.

* * * * *